United States Patent [19]

Anglerot

[11] 4,225,367

[45] Sep. 30, 1980

[54] PRODUCTION OF THIN LAYERS OF POLYCRYSTALLINE SILICON ON A LIQUID LAYER CONTAINING A REDUCING AGENT

[75] Inventor: Didier Anglerot, Paris, France

[73] Assignee: Rhone-Poulenc Industries, Paris, France

[21] Appl. No.: 958,178

[22] Filed: Nov. 6, 1978

[30] Foreign Application Priority Data

Nov. 4, 1977 [FR] France ............................... 77 33170

[51] Int. Cl.$^2$ .................. H01L 21/205; H01L 21/208
[52] U.S. Cl. ..................................... 148/174; 29/572; 136/258; 148/1.5; 148/175; 156/607; 156/609; 156/614; 156/DIG. 64; 357/4; 357/59; 423/350; 427/255.1; 427/255.4
[58] Field of Search ........................ 148/1.5, 174, 175; 156/607, 609, 614, DIG. 64, 88, 89; 427/82, 85, 248 R, 248 A, 248 E, 255; 423/348, 349, 350; 29/572; 357/4, 59; 136/89 TF

[56] References Cited

U.S. PATENT DOCUMENTS

| | | | |
|---|---|---|---|
| 1,241,796 | 10/1917 | Weaver | 423/350 |
| 2,773,745 | 12/1956 | Butler et al. | 423/350 |
| 3,031,275 | 4/1962 | Shockley | 156/607 X |
| 3,139,361 | 6/1964 | Rasmanis | 148/175 |
| 3,346,414 | 10/1967 | Ellis et al. | 156/609 |
| 3,525,146 | 8/1970 | Hayashida et al. | 25/589 |
| 3,580,732 | 5/1971 | Blakeslee et al. | 156/609 |
| 3,990,914 | 11/1978 | Weinstein et al. | 148/174 X |
| 4,053,326 | 10/1977 | Forrat | 148/175 X |
| 4,058,418 | 11/1977 | Lindmayer | 148/175 |
| 4,102,767 | 7/1978 | Mazelsky et al. | 423/350 X |

OTHER PUBLICATIONS

Yoshizawa et al., "Reduction of Silicon Tetrachloride with Aluminum" Chemical Abstracts, vol. 57, 3076i–3077b, (1962).
Zoutendyk, J. A., "Dev. of Low–Cost Silicon ... Solar Energy ... " Solar Energy, vol. 20, 1978, pp. 249–257.
Saito et al., "Enhanced Crystallinity of Silicon Films ... " Applied Physics Letters, vol. 29, No. 9, Nov. 1, 1976, pp. 600–602.
Chang, C. A., "Technique for Making Low Cost Silicon Solar Cell" I.B.M. Tech. Discl. Bull., vol. 20, No. 1, Jun. 1977, p. 389.

Primary Examiner—L. Dewayne Rutledge
Assistant Examiner—W. G. Saba
Attorney, Agent, or Firm—Burns, Doane, Swecker & Mathis

[57] ABSTRACT

Thin layers of polycrystalline silicon are formed atop a metal substrate, by reducing a gaseous silicon containing compound with metallic zinc, in liquid state, and in the presence of at least one other metal which is also in liquid state, same being either tin, lead, gold, silver, antimony and/or bismuth. The reaction is conducted under conditions such that the zinc compound product of reduction is also in gaseous state.

26 Claims, No Drawings

PRODUCTION OF THIN LAYERS OF POLYCRYSTALLINE SILICON ON A LIQUID LAYER CONTAINING A REDUCING AGENT

BACKGROUND OF THE INVENTION

1. Field of the Invention

The present invention relates to the production of elemental silicon crystals useful in the fabrication of a variety of photovoltaic devices, and, more especially, relates to the preparation of polycrystalline silicon in a thin layer by reduction of a silicon containing compound.

2. Description of the Prior Art

The preparation of high purity silicon by reduction of silicon tetrachloride with zinc in the vapor phase is known [Lyon, Olson & Lewis, *Trans. Electrochem. Soc.*, 96, 359 (1949)]. Such reaction takes place at 950° C. and the resultant crystals are needle shaped. The process has the disadvantages of requiring high reaction temperatures, is difficult to operate because the presence of zinc in the vapor phase mandates use of a vaporizer, and also by reason of the fact that the resultant product finds no direct use, since the silicon obtained is in the acicular form and must be remelted at temperatures in excess of 1400° C. to be usable.

In Yoshizawa et al, *Chemical Abstracts*, 57, 3076i–3077b (1962), silicon tetrachloride mixed with a carrier gas is reduced with molten aluminum, the silicon from the reaction being dissolved in the molten aluminum, and then crystallized to powders and plates on cooling. At high temperatures, vapor-phase reduction is said to have occurred to a small extent, with needle and dendritic crystals being formed. When the yield of Si is independent of the flow rate of the SiCl$_4$, after the formation of a thin layer of Si on the surface of the molten aluminum, the reaction is limited by the diffusion of Si in molten Al.

SUMMARY OF THE INVENTION

Accordingly, a major object of the present invention is to provide a process for the production of silicon which eliminates the disadvantages and limitations cited hereinabove, and which specifically provides the features of being operable at a temperature in the general vicinity of 750° C., of being widely and readily applicable, and the product resulting therefrom being facilely directly utilized in the fabrication of a variety of photovoltaic devices, e.g., voltaic piles, because the silicon may be directly recovered in the form of a polycrystalline substrate, which may be conductive.

DETAILED DESCRIPTION OF THE INVENTION

More particularly according to the invention, polycrystalline silicon is produced in a thin layer by reducing a silicon containing compound in the gaseous phase with zinc, which process is characterized in that the zinc is utilized in the liquid state, together with at least one other metal, also in liquid state, and selected from the group comprising tin, lead, gold, silver, antimony, bismuth; the operating conditions of such process being selected such that the zinc compound formed during the reaction is in the gaseous state.

In the description which follows, "M" shall designate at least one of the metals tin, lead, gold, silver, antimony or bismuth.

The silicon containing compound reduced according to the invention may be any one or more of those silicon compounds which remain in the gaseous state under the conditions of the reaction and which are capable of forming a compound of zinc under said conditions. According to one especially desirable embodiment of the invention, the silicon halides and preferably silicon tetrachloride, are utilized because the latter compound, while readily commercially available, too is easily purified by conventional methods.

The silicon containing compound is introduced in gaseous state into the reaction medium; same may be utilized in pure state or may be diluted with a pure, anhydrous gas. Among such gases, the following are noted as being particularly advantageous: nitrogen, argon, hydrogen, or a mixture of said gases; the diluent gas must not, however, reduce the silicon containing compound under the conditions of the reaction and must at the same time permit such medium to retain its reducing nature. The volume ratio of the diluent gas with respect to the silicon containing compound may vary over wide limits; in practice, ratios varying from 0 to 1000 are suitable, with ratios ranging from 0.5 to 5 being preferred.

The partial pressure of the gaseous silicon containing compound is not a critical feature according to the invention; in practice, a partial pressure comprised between about $10^{-3}$ atmosphere and 1 atmosphere is suitable for the purpose of the invention.

The zinc and M are employed according to the invention in the liquid state. They may be introduced in the reaction medium separately or simultaneously. According to one embodiment of the invention, the zinc may be replaced, either completely or partially, by a metal which is also liquid under the conditions of the reaction. This metal must reduce the silicon compound, must not form silicides and must yield, upon reaction with the silicon containing compound, a compound which is also in the gaseous state. Metals satisfying these conditions are, notably, aluminum, gallium and indium.

The proportion by weight of the zinc utilized according to the invention too may vary over the limits, but it is preferably less than 15%, and typically is comprised between 1 and 10%, of the zinc/M combination.

Although it has not been clearly established, and not wishing to be bound by this theory, it is thought that M performs a dual function; on the one hand, it lowers the vapor pressure of the zinc in the reaction medium, thus preventing possible loss of the reducing agent, while on the other hand it serves, possibly in association with the zinc, as the crystallization substrate for the silicon formed during the reaction.

If M is a mixture of several metals according to the invention, said metals must be present in proportions such that M remains liquid under the conditions of reaction.

According to the invention, the reaction may be effected on a solid support wetted by the liquid phase and containing no elements which would diffuse into the layer of silicon.

The operating conditions of the process according to the invention must be selected such that the silicon compound is in the gaseous state, that the zinc and M be in the liquid state and that the zinc compound formed during the reaction be in the gaseous state. A temperature comprised between 500° and 907° C., and preferably between 700° and 800° C., and a total pressure comprised between $10^{-3}$ and 1 atmosphere, and preferably 1 atmosphere, are suitable for purposes of the invention. In addition, all traces of humidity or of oxygen must be eliminated from the reaction medium.

After cooling, the silicon is obtained in the form of a polycrystalline thin layer atop the surface of the metallic substrate M. The thin layer of polycrystalline silicon obtained is only a single grain in thickness; this characteristic makes it especially suited for adapting the process of the invention to the production of silicon for direct use in the fabrication of photovoltaic devices. While the size of the crystals obtained may attain a value of 1 mm in thickness; for direct applications in the fabrication of photovoltaic devices, the preferred thickness of the thin layer varies from between 50 and 300 microns.

In order to further illustrate the present invention and the advantages thereof, the following specific example is given, it being understood that same is intended only as illustrative, and in nowise limitative.

EXAMPLE

Sixty g of a zinc-tin alloy containing 10% by weight zinc, were introduced into a reactor and heated to 750° C. A flow of gas consisting of a mixture of silicon tetrachloride and argon, 75% being argon, was then introduced into the reactor at a rate of 15 liters per hour. The partial pressure of the silicon tetrachloride was maintained at a value of 190 m Hg and the total pressure at 760 mm Hg. The gaseous zinc chloride formed in the course of the reaction was eliminated or vented by the flushing action of the argon-silicon tetrachloride flow.

After 3 hours, the flow of gas was discontinued and the reactor purged with argon. After cooling, a layer of polycrystalline silicon having a thickness of approximately 200$\mu$ atop a tin substrate, was recovered.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims.

What is claimed is:

1. A process for the production of elemental silicon crystals capable of being directly utilized in the fabrication of photovoltaic devices, which comprises introducing a gaseous silicon containing compound, in the absence of moisture and oxygen, into contact with a reaction medium comprising metallic zinc, in liquid state, and at least one second metal, also in liquid state, selected from the group consisting of tin, lead, gold, silver, antimony and bismuth, in a manner sufficient to react and reduce said silicon containing compound with the zinc constituent of said liquid metal mixture and to yield the resulting zinc compound product of reduction in the gaseous state.

2. The process as defined by claim 1, wherein the resultant silicon crystals are deposited as a polycrystalline thin layer upon the surface of the liquid second metal.

3. The process as defined by claim 2, wherein the gaseous silicon containing compound in a silicon halide.

4. The process as defined in claim 3, wherein the silicon halide is silicon tetrachloride.

5. The process as defined by claim 2, wherein the gaseous silicon containing compound is diluted with a pure, anhydrous, inert diluent gas.

6. The process as defined in claim 5, wherein said inert diluent gas is selected from the group comprising nitrogen, argon, hydrogen, and mixtures thereof.

7. The process as defined by claim 6, wherein the ratio, by volume, of the diluent gas to the silicon containing compound ranges up to about 1000.

8. The process as defined by claim 7, said ratio ranging from 0.5 to 5.

9. The process as defined by claims 2 or 5, the reduction reaction being conducted at a temperature of from 500° to 907° C., and under a total pressure of from $10^{-3}$ to 1 atmosphere.

10. The process as defined by claim 9, wherein the reaction zone is devoid of humidity and oxygen.

11. The process as defined by claim 10, wherein the proportion, by weight, of zinc to said second metal, is less than 15%.

12. The process as defined by claim 11, said proportion being between 1 and 10%.

13. The process as defined by claim 2, the partial pressure of the gaseous silicon containing compound ranging from $10^{-3}$ to 1 atmosphere.

14. The process as defined by claim 9, the reduction reaction being conducted at a temperature of from 700° to 800° C., and under a total pressure of about 1 atmosphere.

15. The process as defined by claim 2, the said zinc and said second metal being separately introduced to the reaction zone.

16. The process as defined by claim 2, the said zinc and said second metal being simultaneously introduced to the reaction zone.

17. The process as defined by claim 2, at least a portion of the zinc being replaced by a metal selected from the group comprising aluminum, gallium and indium.

18. The process as defined by claim 2, wherein the reduction reaction is effected by introducing the gaseous silicon containing compound onto a solid support wetted by the liquid metal mixture and containing no components that would diffuse into the thin layer of silicon crystals.

19. The process as defined by claim 9, wherein the thin layer of silicon crystals is controlled to be but a single grain in thickness.

20. The process as defined by claim 9, wherein the thin layer of silicon crystals ranges between 50 and 300 microns in thickness.

21. The process as defined by claim 2, said second metal being tin.

22. The process as defined by claim 2, said second metal being lead.

23. The process as defined by claim 2, said second metal being gold.

24. The process as defined by claim 2, said second metal being silver.

25. The process as defined by claim 2, said second metal being antimony.

26. The process as defined by claim 2, said second metal being bismuth.

* * * * *